United States Patent
Miyazaki et al.

(10) Patent No.: US 9,547,058 B2
(45) Date of Patent: *Jan. 17, 2017

(54) **AUTOMATED MRI DETECTION OF TISSUE MACROMOLECULAR T2/T2\* CHARACTERISTICS USING Z-SPECTRA**

(75) Inventors: Mitsue Miyazaki, Des Plaines, IL (US); Cheng Ouyang, Vernon Hills, IL (US); Xiangzhi Zhou, Vernon Hills, IL (US)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 1175 days.

This patent is subject to a terminal disclaimer.

(21) Appl. No.: 13/601,723

(22) Filed: Aug. 31, 2012

(65) Prior Publication Data

US 2014/0062473 A1 Mar. 6, 2014

(51) Int. Cl.
*G01R 33/50* (2006.01)
*G01R 33/54* (2006.01)
(Continued)

(52) U.S. Cl.
CPC ........... *G01R 33/50* (2013.01); *G01R 33/4816* (2013.01); *G01R 33/54* (2013.01); *G01R 33/543* (2013.01); *G01R 33/5605* (2013.01)

(58) Field of Classification Search
USPC ............................. 324/300–322; 600/407–435
See application file for complete search history.

(56) References Cited

U.S. PATENT DOCUMENTS

2014/0062473 A1\* 3/2014 Miyazaki ............... G01R 33/50 324/308
2014/0062476 A1\* 3/2014 Miyazaki ........... G01R 33/5605 324/309

(Continued)

FOREIGN PATENT DOCUMENTS

JP 11-313810 11/1999
JP 2002-248092 9/2002

OTHER PUBLICATIONS

Balaban, et al., "Magnetization Transfer Contrast in Magnetic Resonance Imaging," *Magnetic Resonance Quarterly*, vol. 8, No. 2, pp. 116-137 (1992).

(Continued)

*Primary Examiner* — Melissa Koval
*Assistant Examiner* — Tiffany Fetzner
(74) *Attorney, Agent, or Firm* — Nixon & Vanderhye P.C.

(57) ABSTRACT

A magnetic resonance imaging (MRI) system and method (a) acquires k-space data for a patient ROI over a predetermined band of RF frequencies using RF excitation pulses having respectively corresponding RF frequencies incrementally offset from a nuclear magnetic resonant (NMR) Larmor frequency for free nuclei thus causing chemical exchange saturation transfer (CEST) effects and to process such acquired data into Z-spectra data for voxels in the ROI; (b) analyzes the acquired Z-spectra data to provide spectral peak width data corresponding to T2/T2\* tissue values in the ROI for macromolecules participating in magnetization transfer contrast (MTC) effects producing said Z-spectra data; and (c) stores and/or displays data representative of T2/T2\* tissue values of the ROI which values are different for different tissues.

23 Claims, 7 Drawing Sheets

(51) Int. Cl.
*G01R 33/48* (2006.01)
*G01R 33/56* (2006.01)

(56) References Cited

U.S. PATENT DOCUMENTS

| | | | | | |
|---|---|---|---|---|---|
| 2014/0361776 | A1* | 12/2014 | Miyazaki | ............ | G01R 33/5605 324/322 |
| 2015/0141804 | A1* | 5/2015 | Rooney | ................ | A61B 5/0037 600/419 |
| 2015/0247908 | A1* | 9/2015 | Liu | .................... | G01R 33/4804 324/309 |

OTHER PUBLICATIONS

Bottomley, et al., "Anatomy and Metabolism of the Normal Human Brain Studied by Magnetic Resonance at 1.5 Tesla," *Radiology*, vol. 150, pp. 441-446 (1984).

Fralix, et al., "Lipid Bilayer and Water Proton Magnetization Transfer: Effect of Cholesterol," *Magn. Reson. Med.*, vol. 18, pp. 214-223 (1991).

Koenig, "Cholesterol of Myelin is the Determinant of Grey-White Contrast in MRI of Brain," *Magn. Resort. Med.*, vol. 20, pp. 285-291 (1991).

Koenig, et al., "Relaxometry of Brain: Why White Matter Appears Bright in MRI," *Magn. Reson. Med.*, vol. 14, pp. 482-495 (1990).

Pike, et al., "Magnetization Transfer Time-of-Flight Magnetic Resonance Angiography," *Magn. Reson. Med.*, vol. 25, pp. 372-379 (1992).

Ward, et al., "A New Class of Contrast Agents for MRI Based on Proton Chemical Exchange Dependent Saturation Transfer (CEST),"*J. Magn. Reson.*, vol. 143, pp. 79-87 (2000).

Balaban et al., "Magnetization Transfer Contrast in Magnetic Resonance Imaging," Magnetic Resonance Quarterly, vol. 8, No. 2, pp. 116-137 (1992).

Wolff, et al., "Magnetization Transfer Contrast (MTC) and Tissue Water Proton Relaxation in Vivo," Magnetic Resonance in Medicine, vol. 10, pp. 135-144 (1989).

Zhou, et al., "Chemical exchange saturation transfer imaging and spectroscopy," Progress in Nuclear Magnetic Resonance Spectroscopy, vol. 48, pp. 109-136 (2006).

van Zijl, et al., "Chemical Exchange Saturation Transfer (CEST): What is in a Name and What Isn't?," Magnetic Resonance in Medicine, vol. 65, pp. 927-948 (2011).

Constable, et al., "The Loss of Small Objects in Variable TE Imaging: Implications for FSE, RARE, and EPI," Magnetic Resonance in Medicine, vol. 28, pp. 9-24 (1992).

International Search Report issued Sep. 24, 2013 in PCT/JP2013/073234.

V. L. Yarnykh et. al., "Macromolecular proton fraction mapping of the human liver in vivo: technical feasibility and preliminary observations in hepatic fibrosis," Proc. Intl. Soc. Mag. Reson. Med. 19 (2011), 2011.07.13, p. 392.

R. Scheidegger, et al., "Quantitative modeling of in-vivo amide proton transfer measurements in the human brain indicates a dominant signal contribution from proteins with short T2 relaxation times," Proc. Intl. Soc. Mag. Reson. Med. 19 (2011), Jul. 13, 2011, p. 2768.

J. Hua, et al., "Quantitative Description of Magnetization Transfer (MT) Asymmetry in Experimental Brain Tumors," Proc. Intl. Soc. Mag. Reson. Med. 15 (2007), May 19, 2007, p. 882.

\* cited by examiner

AUTOMATED MRI DETECTION OF TISSUE MACROMOLECULAR T2/T2* CHARACTERISTICS USING Z-SPECTRA

FIELD

The subject matter below relates generally to magnetic resonance imaging (MRI) apparatus and process. In particular, the MRI apparatus and method described below involve the magnetization transfer contrast (MTC) effect used to create chemical exchange saturation transfer referred to as Z-spectra.

DETAILED DESCRIPTION

Figure 1:
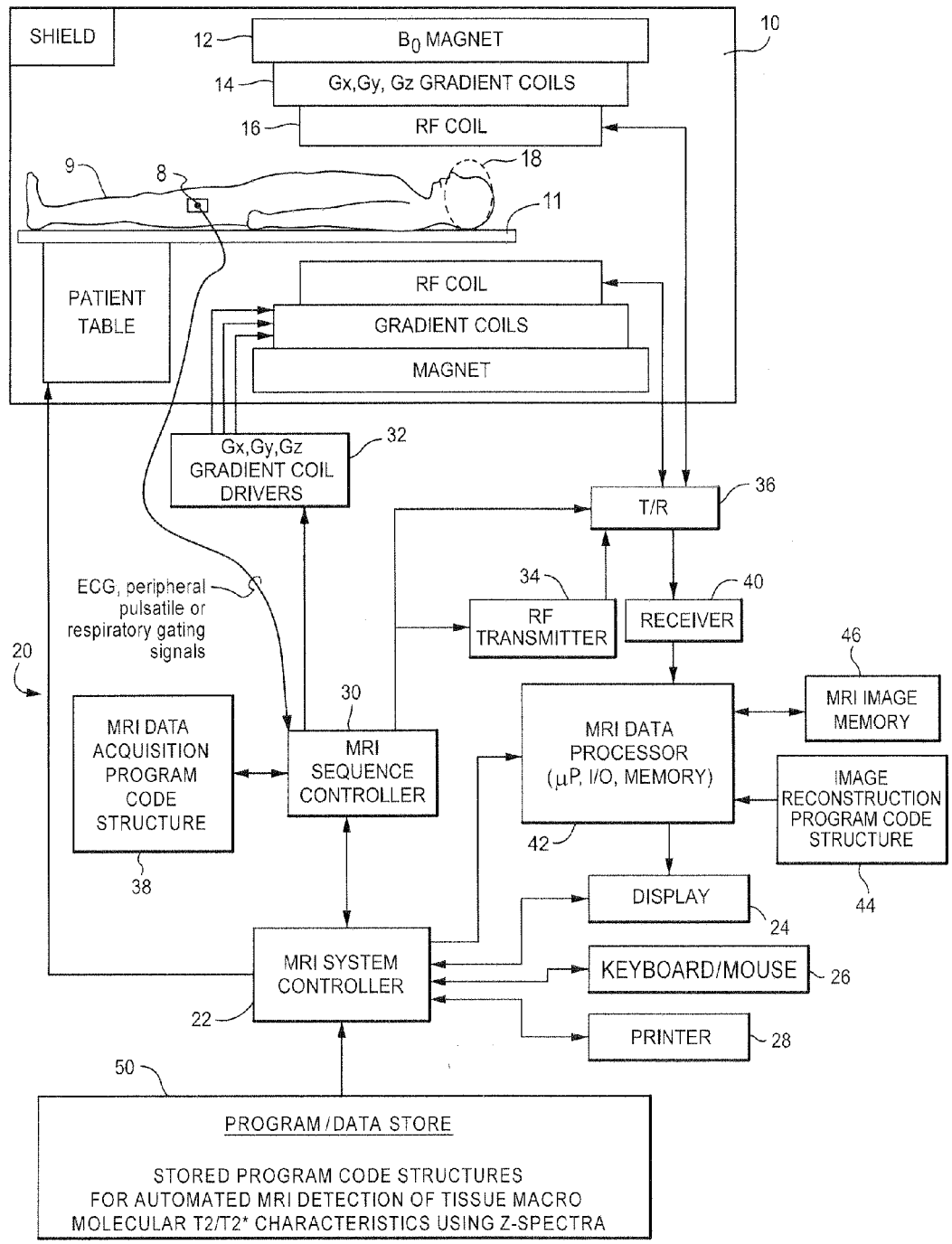
FIG. 1 is a high-level schematic block diagram of an exemplary MRI system embodiment configured to provide automated MRI detection of tissue macromolecular T2/T2* characteristics using Z-spectra.

The MRI system shown in FIG. 1 includes a gantry 10 (shown in schematic cross-section) and various related system components 20 interfaced therewith. At least the gantry 10 is typically located in a shielded room. The MRI system geometry depicted in FIG. 1 includes a substantially coaxial cylindrical arrangement of the static field Bo magnet 12, a Gx, Gy and Gz gradient coil set 14 and an RF coil assembly 16. Along the horizontal axis of this cylindrical array of elements is an imaging region 18 shown as substantially encompassing the anatomy of interest (i.e., region of interest or "ROI") for a patient 9 (e.g., the abdomen) supported by a patient bed or table 11.

An MRI system controller 22 has input/output ports connected to display 24, keyboard/mouse 26 and printer 28. As will be appreciated, the display 24 may be of the touch-screen variety so that it provides control inputs as well.

The MRI system controller 22 interfaces with MRI sequence controller 30 which, in turn, controls the Gx, Gy and Gz gradient coil drivers 32, as well as RF transmitter 34 and transmit/receive switch 36 (if the same RF coil is used for both transmission and reception). As those skilled in the art will appreciate, many different types of RF coils (e.g., whole body coils, surface coils, birdcage coils, coil arrays, etc.) may be employed to transmit and/or receive RF signals to/from the ROI in the imaging volume. As will also be appreciated, one or more suitable physiological transducers 8 may be affixed to the patient's body to provide ECG (electrocardiogram), respiratory and/or peripheral pulsatile gating signals to the MRI sequence controller 30. The MRI sequence controller 30 also has access to suitable program code structure 38 for implementing MRI data acquisition sequences already available in the repertoire of the MRI sequence controller 30—e.g., to generate MR images including MTC and/or Z-spectral effects using operator and/or system inputs defining particular MRI data acquisition sequence parameters.

The MRI system 20 includes an RF receiver 40 providing input to data processor 42 so as to create processed image data which may be sent to display 24 (or elsewhere for later viewing). The MRI data processor 42 is also configured for access to image reconstruction program code structure 44 and to MR (magnetic resonance) image memory 46 (e.g., for storing MR image data derived from processing in accordance with the exemplary embodiments and the image reconstruction program code structure 44).

Also illustrated in FIG. 1 is a generalized depiction of an MRI system program/data store 50 where stored program code structures (e.g., for MRI detection of tissue macromolecular T2/T2* characteristics using Z-spectra, a related graphical user interface (GUI), operator inputs to same, etc.) are stored in computer readable storage media accessible to the various data processing components of the MRI system. As those in the art will appreciate, the program store 50 may be segmented and directly connected, at least in part, to different ones of the system 20 processing computers having most immediate need for such stored program code structures in their normal operation (i.e., rather than being commonly stored and connected directly to the MRI system controller 22).

Indeed, as those skilled in the art will appreciate, the FIG. 1 depiction is a very high level simplified diagram of a typical MRI system with some modifications so as to practice exemplary embodiments to be described hereinbelow. The system components can be divided into different logical collections of "boxes" and typically comprise numerous digital signal processors (DSP), microprocessors, special purpose processing circuits (e.g., for fast A/D conversions, fast Fourier transforming, array processing, etc.). Each of those processors is typically a clocked "state machine" wherein the physical data processing circuits progress from one physical state to another upon the occurrence of each clock cycle (or predetermined number of clock cycles).

Not only does the physical state of processing circuits (e.g., CPUs, registers, buffers, arithmetic units, etc.) progressively change from one clock cycle to another during the course of operation, the physical state of associated data storage media (e.g., bit storage sites in magnetic storage media) is transformed from one state to another during operation of such a system. For example, at the conclusion of an MR imaging reconstruction process, an array of computer-readable accessible data value storage sites (e.g., multi-digit binary representations of pixel values) in physical storage media will be transformed from some prior state (e.g., all uniform "zero" values or all "one" values) to a new state wherein the physical states at the physical sites of such an array (e.g., of pixel values) vary between minimum and maximum values to represent real world physical events and conditions (e.g., the tissues of a patient over an imaged region space). As those in the art will appreciate, such arrays of stored data values represent and also constitute a physical structure—as does a particular structure of computer control program codes that, when sequentially loaded into instruction registers and executed by one or more CPUs of the MRI system 20, cause a particular sequence of operational states to occur and be transitioned through within the MRI system.

The exemplary embodiments described below provide improved ways to acquire and/or process MRI data acquisitions and/or to generate and display MR images.

The magnetization transfer contrast (MTC) effect can be observed as a decrease of free proton NMR response signal, as a result of an exchange with NMR magnetization macromolecules caused by applying an off-resonance (i.e., offset from the Larmor frequency of free protons) RF excitation pulse. The chemical exchange saturation transfer (CEST) spectra (or, more generally, Z-spectra, especially where protons of water ($H_2O$) are involved) is a spectrum derived from the MTC effect over a frequency range of about +/−5 ppm (or +/−650 Hz at 3 T). In order to obtain a Z-spectrum showing short T2/T2* components, one needs to acquire a relatively wide frequency range of MTC-affected proton signals. In particular, the NMR magnetization exchangeable proton in macromolecules may have multiple environments. In order to find corresponding multiple frequency components, at least two components including short and long T2/T2* components are visualized—e.g., as on the Z-spectra images by curve fitting.

In exemplary embodiments, a "short" FWHM means a long T2/T2* component, which has about 70% of exchangeable protons. Conversely, a "long" FWHM means a "short" T2/T2* component occupying about 20% of exchangeable protons. The FWHM value is translated in the microsecond range and 100 μs is considered quite short. 200 μs T2/T2* is relatively long. It presently appears that the short T2/T2* component may represent exchangeable protons within the myelin sheath in an axon. The myelin sheath is located in the white matter. The long T2/T2* component is located in the cell body of neurons, which is located mainly in the grey matter of the brain. Thus, they are not normal or diseased.

In prior Z-spectra techniques, one needed to acquire each set of image data by using different offset frequencies for the MTC pulses and then to plot a Z-spectrum by measuring the signal intensity of the region of interest (ROI). From the Z-spectra, interaction of free water with protons of amide, amine and hydroxyl groups can be observed. In addition, MTC effects can be used to investigate restricted proton and free water exchanges of NMR magnetization to observe better contrast (or signal reduction in free water ROIs) by irradiating with an off-resonance frequency. However, no investigation of the relationship between restricted protons and free water was attempted to find the condition of restricted water protons of macromolecules.

It is now believed that the full width at half magnitude (FWHM) parameters of Z-spectra allow one to evaluate the T2/T2* value of macromolecules. Areas of abnormal tissues (e.g., cancer cells) have different Z-spectra as compared to those from normal tissues. By measuring the FWHM of Z-spectra, one can estimate a T2/T2* value of the abnormal environment.

In order to obtain Z-spectra for such purposes, a suitable graphical user interface (GUI) for Z-spectra is required to set the desired frequency range, increment of offset frequency and type of MRI data acquisition sequence.

Figure 2:
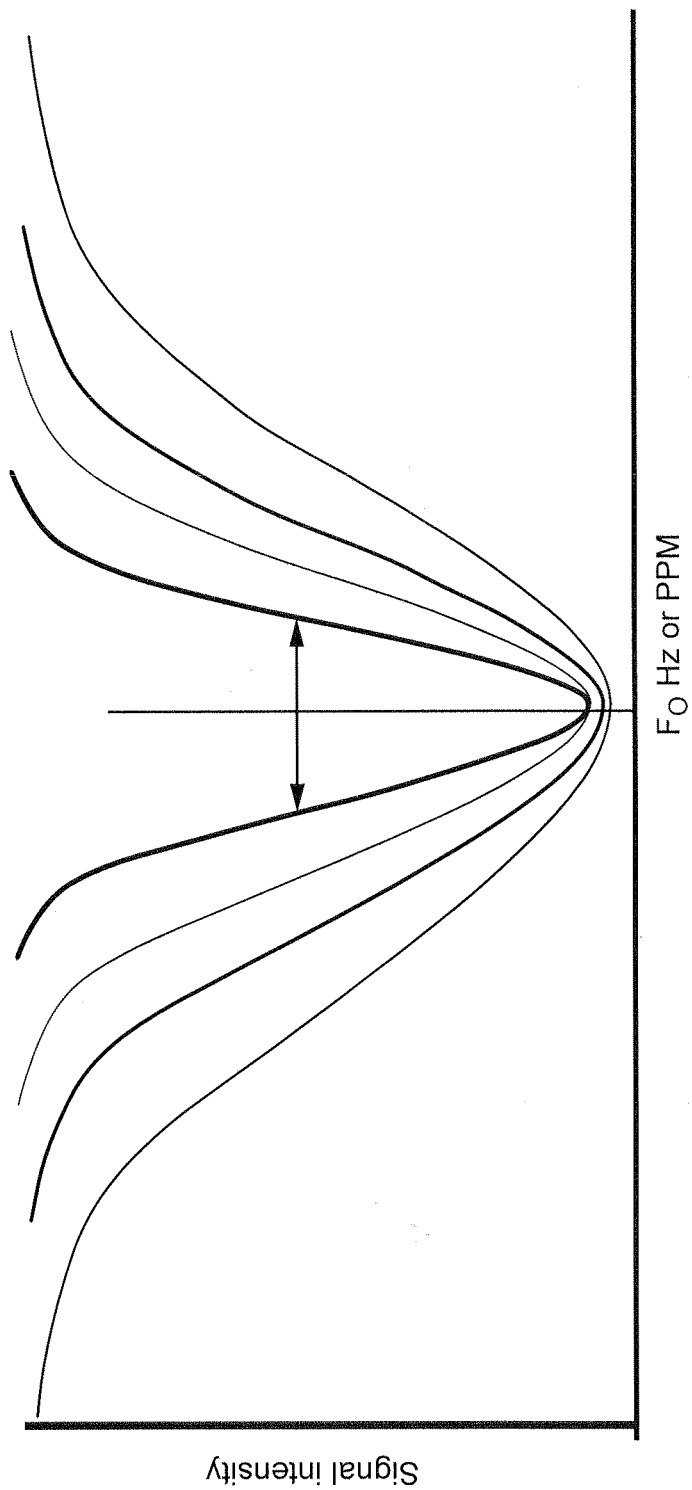
FIG. 2 is a graph of signal intensity versus frequency deviation from the Larmor nuclear magnetic resonant (NMR) frequency for an unrestricted NMR nuclei (i.e., a water proton) demonstrating that the full width half magnitude (FWHM) is inversely related to the T2 NMR parameter of coupled macromolecules.
Figure 3:
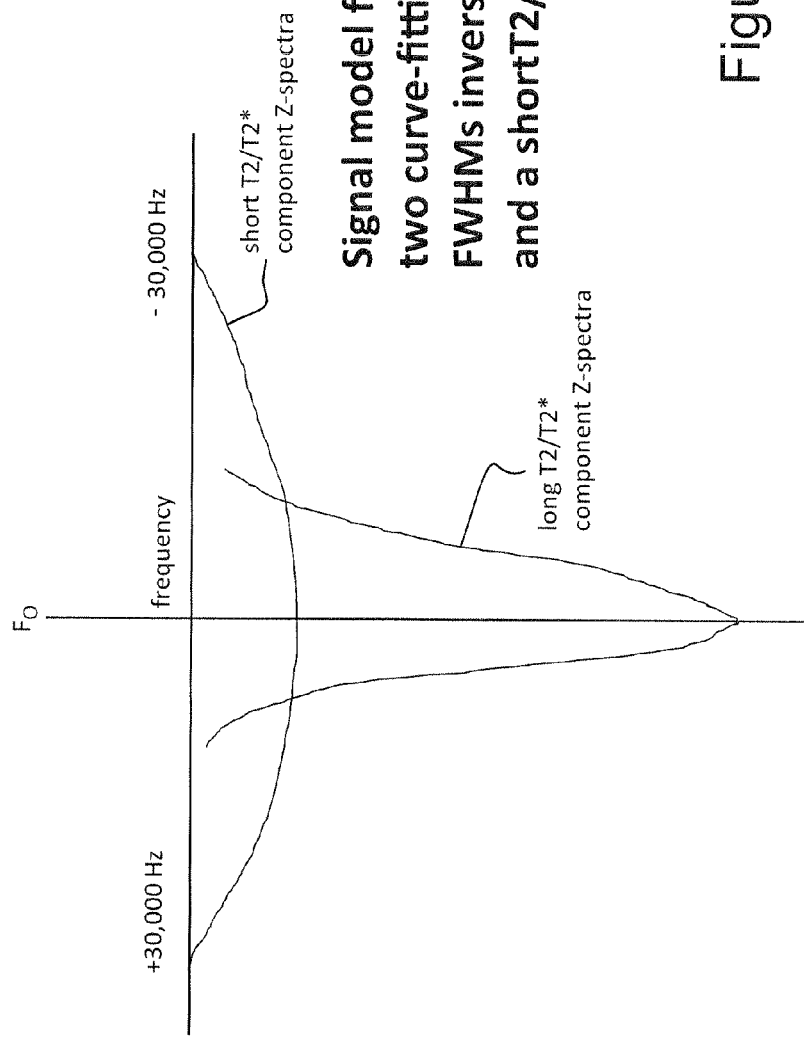
FIG. 3 is a graph depicting two curve-fitting models and their associated "long" and "short" FWHMs (corresponding to T2/T2*) components.

After data acquisition, Z-spectra of regions of interest are plotted and the FWHM parameters (e.g., 1/FWHM is proportional to T2/T2* value of macromolecules) of those spectra are estimated. See, for example, FIG. 2 where the FWHM parameter of a Z-spectral plot represents 1/T2 of a restricted or macromolecular environment. As shown in FIG. 3, signal modeling for Z-spectra may include two-component curve fitting models and FWHMs, namely to respectively simultaneously fit both "long" and "short" T2/T2* components.

An exemplary embodiment allows for automated acquisition of Z-spectra with a proper desired frequency range, increment of offset frequency and output of Z-spectra. After collecting all image data, spectra for voxels of a region of interest (ROI) are calculated from all acquired images. Differentiation and contrast of normal versus abnormal tissue environments can become visually obvious from the acquired and processed images.

The exemplary embodiment provides a GUI for acquiring Z-spectra which includes acquisition of Z-spectra images, Z-spectra and calculation of a full width at half maximum (FWHM) parameter of the Z-spectra. The acquisition can be controlled by a selectable spectral width, a selectable increment of off-resonance frequency (e.g., 500 Hz increments from −30,000 Hz to +30,000 Hz, or a smaller increment near $F_0$ with larger increments at frequency offsets >±5,000 Hz). For example, in one embodiment there might be 53 data points acquired by using the following frequency offsets having varying incremental differences there between (e.g., using increments of 2 KHz, 3 KHz, and 50 Hz) with smaller increments towards the middle of the overall −30 KHz to +30 KHz range so that acquired data points are more concentrated near the mid range where spectral peaks are expected:

−30 KHz; −28 KHz; −25 KHz; −22 KHz; −19 KHz; −16 KHz; −13 KHz; −10 KHz; −7 KHz; −4 KHz; −1 KHz; −750 Hz; −700 Hz; −650 Hz; −600 Hz; −550 Hz; −500 Hz; −450 Hz; −400 Hz; −350 Hz; −300 Hz; −250 Hz; −200 Hz; 150 Hz; −100 Hz; −50 Hz; 0 Hz; +50 Hz; +100 Hz; +150 Hz; +200 Hz; +250 Hz; +300 Hz; +350 Hz; +400 Hz; +450 Hz; +500 Hz; +550 Hz; +600 Hz; +650 Hz; +700 Hz; +750 Hz; +1 KHz; +4 KHz; +7 KHz; +10 KHz; +13 KHz; +16 KHz; +19 KHz; +22 KHz; +25 KHz; +28 KHz; and +30 KHz.

The MRI data acquisition sequence itself can be virtually any desired sequence (e.g., FASE, EPI, bSSFP, FFE, FE, FSE, SE, etc.), including 2D and 3D sequences. Each image data set for a selected ROI gives Z-spectrum and FWHMs. After acquiring the Z-spectra, FWHMs of any specified area of the ROI can be calculated to provide two T2/T2* values (e.g., long and short ranges) for the macromolecule environments. After collecting all image data, FWHM or T2/T2* values in the region of interest (ROI) are calculated from the acquired images. Preferably, the k-space data is acquired over the designated spectral width as MRI data sets from the same sequence or linked sequences while maintaining substantially constant RF signal receiver gain.

Curve fitting of at least two components (e.g., long and short) in the Z-spectra provides short and long T2 components with overlay of T2 amounts on the obtained images. The FWHMs (or T2/T2*) of typical expected normal values (short and long) at each organ in normal variation can be used as a reference, while different FWHM (or T2/T2*) values can be used to indicate diseased areas.

Figure 4:
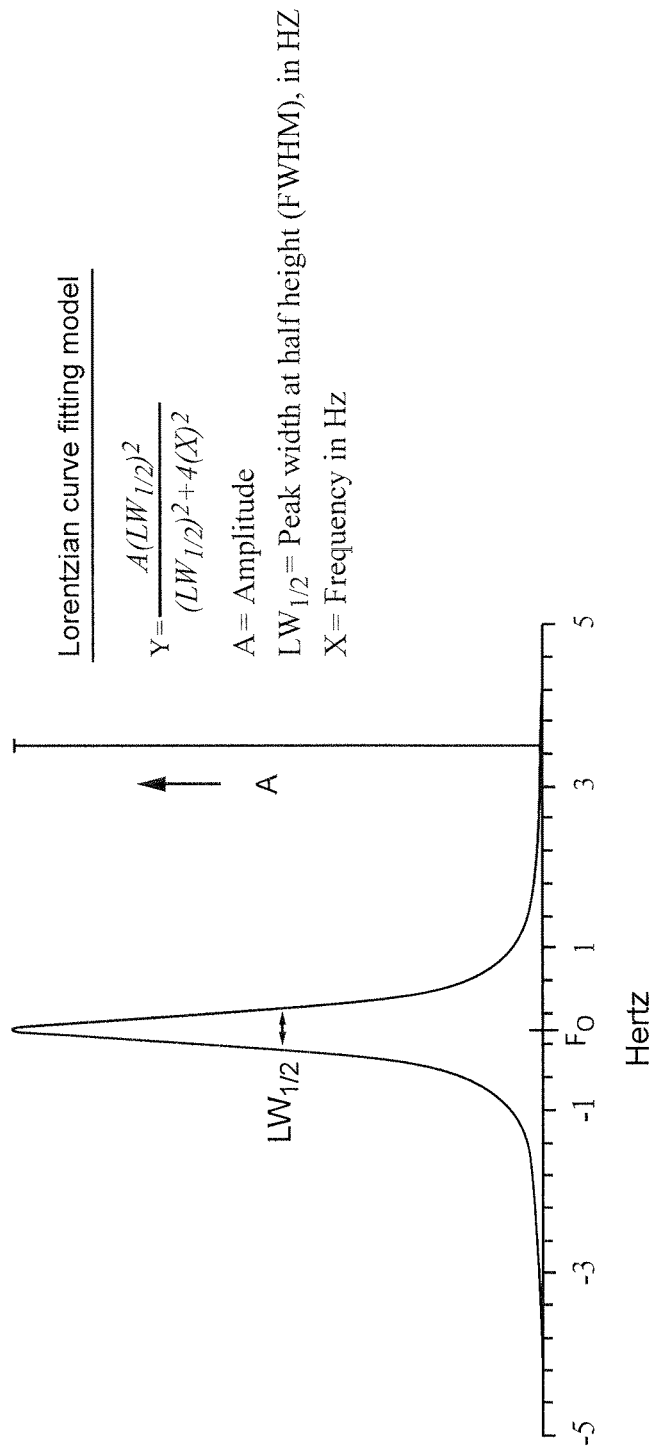
FIG. 4 is another graph of a spectral response curve fitting analysis for determining FWHM.
Figure 5:
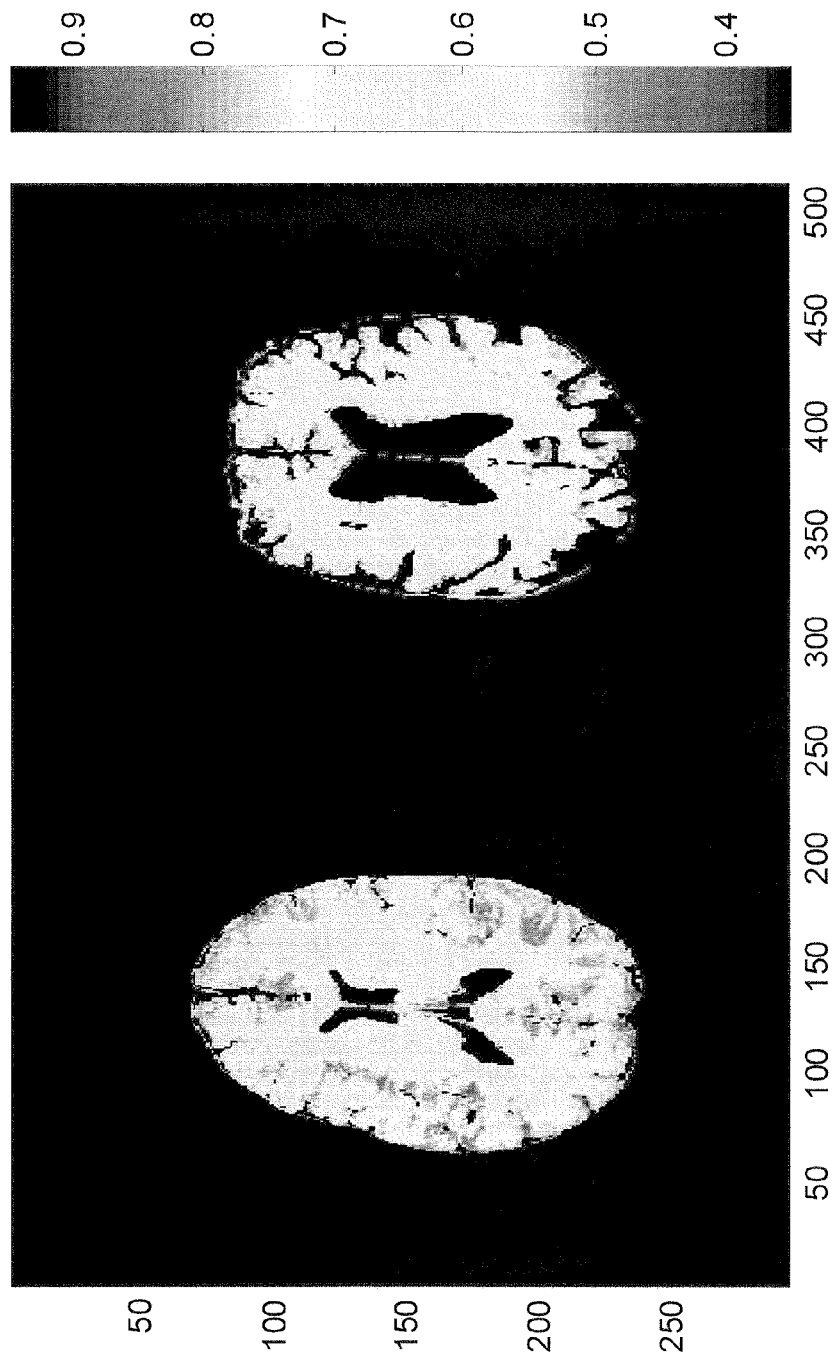
FIG. 5 presents images for young and senior volunteers showing relative amplitudes of the long T2/T2* pool.

One possible curve fitting model uses a Lorentzian line shape (as depicted in FIG. 4):

$$y = \left( A_1 \frac{LW_1^2}{LW_1^2 + 4x^2} + A_2 \frac{LW_2^2}{LW_2^2 + 4x^2} \right)$$

y: normalized measured z-spectrum
x: offset frequency [−30, 30] KHz
$A_{1/2}$: Amplitudes of the long/short T2/T2* pools
$LW_{1/2}$: FWHMs of the long/short T2/T2* pools Amplitudes of a "long" T2/T2* pool for young and senior volunteers are depicted in FIG. 5.

Figure 6:
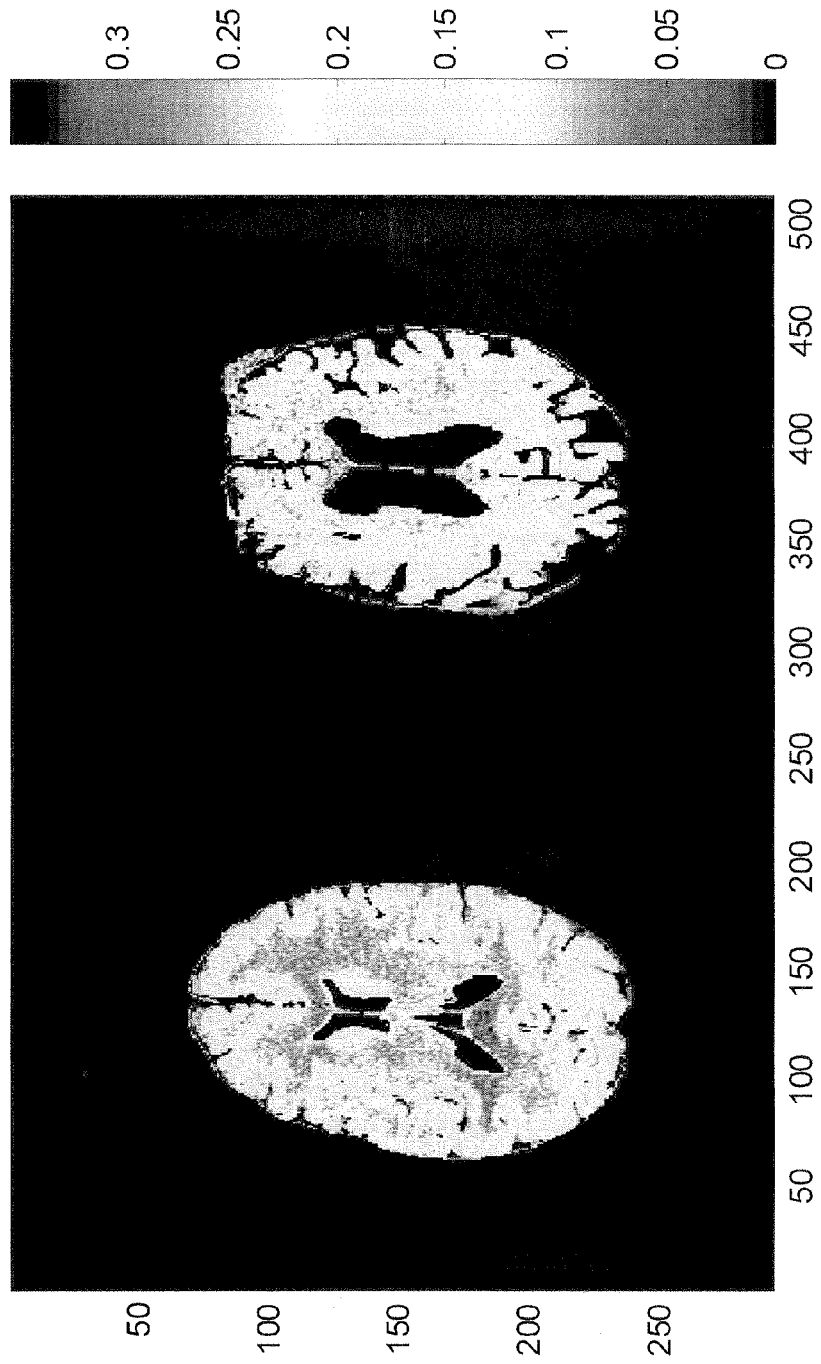
FIG. 6 similarly depicts images showing relative amplitudes of ultra-short T2/T2* pool for the young and senior volunteers.

Amplitudes of an ultra "short" T2/T2* pool for young and senior volunteers are depicted in FIG. 6.

An example result of curve fitting and parameter extraction is shown in Table 1 below (where GM=grey matter and WM=white matter):

TABLE 1

| Subjects | | A1 | $LW_1$ (Hz) | T2* (µs) | A2 | $LW_2$ (Hz) | T2* (µs) |
|---|---|---|---|---|---|---|---|
| Young | GM | 0.77 | 368 | 2713.9 | 0.13 | 11426 | 87.5 |
|  | WM | 0.69 | 426 | 2346.9 | 0.23 | 10081 | 99.2 |
| Senior | GM | 0.69 | 329 | 3041.0 | 0.10 | 19362 | 51.6 |
|  | WM | 0.68 | 409 | 2442.2 | 0.18 | 7600 | 131.6 |

The example curve fitting result provides long T2* as a majority (around 70%) component, and short T2* as a minority (e.g., about 10-20%) component. The long T2* component of macromolecules shows a relatively high percentage in the grey matter, whereas the short T2* component shows a relatively higher portion in the white matter. In one embodiment, a "short" T2/T2* FWHM range may comprise values less than 100 µs while a "long" T2/T2* FWHM range may comprise values more than 100 µs.

Figure 7:
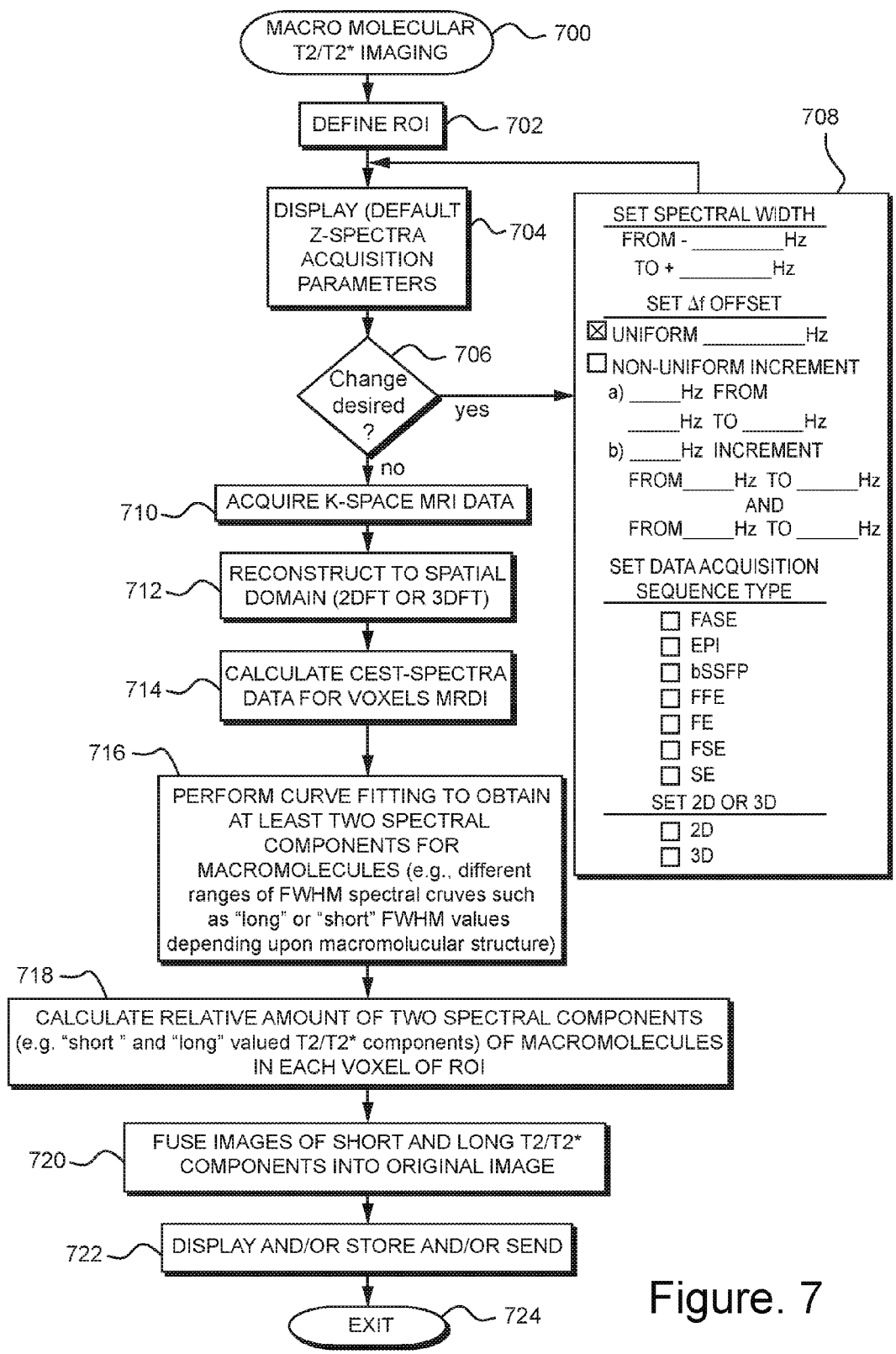
FIG. 7 is a schematic illustration of exemplary computer program code structure in the form of a flow chart for implementing an exemplary embodiment of automated MRI detection of tissue macromolecular T2/T2* characteristics using Z-spectra.

As depicted at FIG. 7, the macromolecular T2/T2* imaging routine is entered at 700. A desired ROI is defined conventionally at 702. Thereafter, at 704, a set of default Z-spectra acquisition parameters may be displayed. Of course, the default may be set to either nominal or null values so as to require operator inputs as may be desired. In any event, at 706, the operator is given an opportunity to indicate whether changes in the displayed acquisition parameters are desired. If so, then control is passed to box 708 where the spectral width, increments of frequency offset (uniform or non-uniform in the exemplary embodiment depending upon different points or ranges in the frequency spectrum) are presented to the operator. In the exemplary embodiment, the operator is also given an opportunity to define which type of MRI data acquisition sequence is to be employed and whether 2D or 3D acquisition is to be employed. Once the operator has set the minimal required inputs at 708, then those are displayed again at 704 and the operator is given another chance to change the parameters if desired at 706.

Eventually, the acquisition parameters are set to the operator's satisfaction and control is then passed to 710 where k-space MRI data is acquired for each incremented offset frequency over the selected spectral bandwidth using the set data acquisition type of sequence, and whether 2D or 3D, etc. Once the MRI data has been acquired at each frequency (or possibly starting even concurrently with the acquisition of some later acquired data), processing passes to block 712 where acquired k-space MRI data is reconstructed to the spatial domain using 2DFT or 3DFT techniques known in the art. Thereafter, the acquired image data is processed at 714 so as to calculate Z-spectra data for the ROI voxels. In the preferred exemplary embodiment, curve fitting techniques are used at 716 so as to identify at least two spectral components for macromolecules participating in the MTC magnetization exchange process. For example, different ranges of FWHM spectral curves such as "long" and "short" values may be defined reflecting different macromolecular structures participating in the CEST process. At 718, in the preferred embodiment, the relative amount of these two different spectral components are calculated for the ROI (e.g., possibly on a pixel-by-pixel basis which are then compared to find whether there are more short- or more long-valued components found in the pixels/voxels of the designed ROI).

At box 720 in FIG. 7, images of short and long T2/T2* components are fused onto an original MR image of the ROI. The resultant composite image is then displayed at 722 (or stored for later display and/or sent to some other location for similar display/storage). Ultimately, the sub-routine is exited at 724 and control is passed back to the calling higher level operating system or the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) system comprising:
    an MRI gantry having static and gradient magnet assemblies and at least one radio frequency (RF) coil defining an image volume into which a patient region of interest (ROI) can be disposed;
    MRI control circuits connected to control components within said MRI gantry and configured to effect MRI data acquisition sequences of RF and gradient magnetic pulses and thereby elicit MRI signals from patient tissue when an ROI is disposed therein, the MRI control circuits also being configured to acquire and process said elicited MRI signals, in at least one MRI processor, into MR image data;
    said at least one MRI processor and MRI control circuits being configured to
    (a) acquire k-space data of a patient ROI over a predetermined band of RF frequencies using the at least one RF coil and RF excitation pulses having respectively corresponding RF frequencies that are incrementally offset from a nuclear magnetic resonant (NMR) Larmor frequency of free nuclei thus causing chemical exchange saturation transfer (CEST) effects and to process this acquired k-space data into Z-spectra data at plural voxels in the ROI;
    (b) analyze the processed Z-spectra data with the at least one MRI processor in order to provide spectral peak width data corresponding to at least one of T2 or T2* tissue values in the ROI that represent macromolecules participating in the magnetization transfer contrast (MTC) effects which produced said Z-spectra data; and
    (c) store and/or display, with a memory and/or a graphical user interface (GUI) connected to the at least one MRI processor, data representative of at least one of T2 or T2* tissue values of the ROI, based on said spectral peak width data, in which the T2 or T2* values are different for different tissues.

2. An MRI system as in claim 1, wherein said spectral peak width data is based on calculation of full width half maximum (FWHM) values for the Z-spectra data.

3. An MRI system as in claim 2, wherein said MRI control circuits are configured to distinguish between FWHM values associated with normal tissue or FWHM values associated with diseased tissue.

4. An MRI system as in claim 3, wherein said at least one MRI processor and MRI control circuits are further configured to define at least two ranges of FWHM values comprising a first range of FWHM values that is larger than a second range of FWHM values, whereby one of said first or second ranges is associated with diseased tissue and another of said ranges is associated with normal tissue.

5. An MRI system as in claim 4, wherein said at least one MRI processor and MRI control circuit are configured to detect at least one of a short T2, or a short T2* FWHM value of:
   (a) less than 500 microseconds, while corresponding to a frequency range of ±1,000 Hz; and
   (b) less than 50 microseconds, while corresponding to a frequency range of ±10,000 Hz.

6. An MRI system as in claim 1, wherein said at least one MRI processor and MRI control circuits are configured to provide a graphical user interface (GUI) that provides an operator with the choice of the spectral bandwidth as well as the increments of frequency offset that are to be used in acquiring k-space data of the patient ROI as data sets from a single MRI RF excitation pulse sequence or a series of linked MRI RF excitation pulse sequences with a substantially constant receiver gain.

7. An MRI system as in claim 6, wherein said GUI provides the operator with a choice of non-uniform increments with respect to the frequency offset.

8. An MRI system as in claim 1, wherein said at least one MRI processor and MRI control circuits are further configured to analyze the processed Z-spectra data by performing curve fitting onto the acquired Z-spectra data points.

9. An MRI system as in claim 1, wherein said at least one MRI processor and MRI control circuits are further configured to overlay pixel data representing at least one of T2 or T2* tissue values respectively onto the corresponding pixels of a reconstructed MR image.

10. An MRI system as in claim 1, wherein said at least one MRI processor and MRI control circuits are further configured to calculate for an ROI (a) a first range of the spectral peak width data and (b) a second range of the spectral peak width data in order to generate an image of the ROI with a visually discernable characteristic corresponding to either the calculated first range or the calculated second range.

11. An MRI system as in claim 9, wherein said at least one MRI processor and MRI control circuits are further configured to generate an image of the ROI with one of two visually discernable characteristics based on whether said calculated first range or the calculated second range is above or below a predetermined threshold.

12. A magnetic resonance imaging (MRI) method comprising:
   (a) acquiring k-space data of a patient ROI over a predetermined band of RF frequencies using at least one RF coil and RF excitation pulses having respectively corresponding RF frequencies that are incrementally offset from a nuclear magnetic resonant (NMR) Larmor frequency of free nuclei thus causing chemical exchange saturation transfer (CEST) effects and, using an MRI processor, processing this acquired k-space data into Z-spectra data at plural voxels in the ROI;
   (b) analyzing the processed Z-spectra data with an MRI processor in order to provide spectral peak width data corresponding to at least one of T2 or T2* tissue values in the ROI that represent macromolecules participating in the magnetization transfer contrast (MTC) effects which produced said Z-spectra data; and
   (c) storing and/or displaying, with a memory and/or a graphical user interface (GUI) connected to the MRI processor, data representative of at least one of T2 or T2* tissue values of the ROI, based on said spectral peak width data, in which the at least one of T2 or T2* values are different for different tissues.

13. An MRI method as in claim 12, wherein said spectral peak width data is based on calculation of full width half maximum (FWHM) values for the Z-spectra data.

14. An MRI method as in claim 13, wherein said FWHM values are used to distinguish between normal tissue and diseased tissue by distinguishing between FWHM values associated with normal tissue or FWHM values associated with diseased tissue.

15. An MRI method as in claim 14, wherein at least two ranges of FWHM values comprising a first range of FWHM values are defined to distinguish between different tissues, said two ranges comprising:
   a first range of FWHM values that is larger than a second range of FWHM values, whereby one of said first or second ranges is associated with diseased tissue, and another of said ranges is associated with normal tissue.

16. An MRI method as in claim 15 wherein said first range of the FWHM values is larger than 100 µs and said second range of the FWHM values is less than 100µs.

17. An MRI method as in claim 15, wherein:
   said second range comprises at least one of a T2 or T2* FWHM value range of less than 500 microseconds, while corresponding to a frequency range of ±1,000 Hz, and
   said first range comprises a FWHM value range of less than 50 microseconds, while corresponding to a frequency range of ±10,000 Hz.

18. An MRI method as in claim 12, wherein a graphical user interface (GUI) provides an operator with the choice of the spectral bandwidth as well as the increments of frequency offset that are to be used in acquiring k-space data of the patient ROI as data sets from a single MRI RF excitation pulse sequence or a series of linked MRI RF excitation pulse sequences with a substantially constant receiver gain.

19. An MRI method as in claim 18, wherein said GUI provides the operator with a choice of non-uniform increments with respect to the frequency offset.

20. An MRI method as in claim 12, wherein the processed Z-spectra data is analyzed by performing curve fitting onto the acquired Z-spectra data points.

21. An MRI method as in claim 12, wherein pixel data representing at least one of T2 or T2* tissue values are overlaid respectively onto the corresponding pixels of a reconstructed MR image.

22. An MRI method as in claim 12, wherein, for an ROI (a) a first range of the spectral peak width data is calculated and (b) a second range of the spectral peak width data is calculated in order to generate an image of the ROI with a visually discernable characteristic corresponding to either the calculated first range or the calculated second range.

23. An MRI method as in claim 22, wherein an image of the ROI is generated with one of two visually discernable characteristics based on whether said calculated first range or the calculated second range is above or below a predetermined threshold.

* * * * *